(12) United States Patent
Nogami

(10) Patent No.: US 6,436,304 B1
(45) Date of Patent: Aug. 20, 2002

(54) PLASMA PROCESSING METHOD

(75) Inventor: Hiroshi Nogami, Fuchu (JP)

(73) Assignee: Anelva Corporation, Fuchu (JP)

( * ) Notice: Subject to any disclaimer, the term of this patent is extended or adjusted under 35 U.S.C. 154(b) by 1096 days.

(21) Appl. No.: 08/795,197

(22) Filed: Feb. 5, 1997

Related U.S. Application Data

(63) Continuation of application No. 08/558,794, filed on Nov. 15, 1995, now abandoned.

(30) Foreign Application Priority Data

Nov. 29, 1994 (JP) ............................................. 6-319358

(51) Int. Cl.$^7$ .............................. C23F 1/00; H05H 1/24; C23C 14/00
(52) U.S. Cl. .............................. 216/79; 216/67; 216/68; 216/69; 216/70; 216/71; 216/76; 204/192.32; 204/192.35; 204/192.37; 427/569; 427/578; 427/579
(58) Field of Search ....................... 204/192.32, 192.35, 204/192.37; 216/67, 68, 69, 70, 71, 76, 79; 156/643.1, 644.1, 646.1, 662.1; 427/569, 578, 579

(56) References Cited

U.S. PATENT DOCUMENTS

| 4,990,229 A | | 2/1991 | Campbell et al. | ...... 204/298.06 |
| 5,091,049 A | | 2/1992 | Campbell et al. | ............ 156/643 |
| 5,122,251 A | | 6/1992 | Campbell et al. | ...... 204/298.06 |
| 5,421,891 A | * | 6/1995 | Campbell et al. | ....... 118/723 R |
| 5,503,901 A | * | 4/1996 | Sakai et al. | ............... 156/643.1 |

OTHER PUBLICATIONS

Toshiki Nakano et al., "*Helicon Wave Excited Plasmas*," vol. 61, No. 7, (1992), pp. 711–717.

J. Hopwood, "Review of Inductively Coupled Plasmas for Plasma Processing," Plasma Sources Sci. Technol. 1, (1992), pp. 109–116.
Francis F. Chen, "Plasma Ionization By Helicon Waves," Plasma Physics and Controlled Fusion, vol. 33, No. 4, (1991) pp. 339–364.
J. Amorim et al., "High–density Plasma Mode of An Inductively Coupled Radio Frequency Discharge," J. Vac. Sci. Technol. B, vol. 9, No. 2, (Mar./Apr. 1991) pp. 362–365.
Hideo Sugai, "Recent Development of Plasma Source For Thin Films Processing," pp. 15–20.
R.W. Boswell et al., "Large Volume, High Density rf Inductively Coupled Plasma," Appl. Phys. Lett., vol. 50, No. 17, (Apr. 27, 1987), pp. 1130–1132 plus Fig. 2.
T. Shoji, "*Whistler Wave Plasma Production*," (Apr. 1985)–(Mar. 1986) p. 67.
T. Shoji et al., "New Method of Energy Confinement Time Measurement for RF Heated Plasma," pp. 1–12 plus Figs. 1–5 and Table 1.
Sugai, "Recent Development of Plasma Sources for Thin Films Processing", pp. 15–20, Proceedings of The 12th Symposium on Ion Beam Technology Hosei University, Dec. 1993.*
Nakano et al., "Helicon wave excited plasmas", vol. 61, No. 7, pp. 711–717, Jul. 1992.*
Amorim et al., "High–density Plasma Mode of an Inductively Coupled Radio Frequency Discharge," J. Vac. Sci. Technol. B, vol. 9, No. 2, pp. 362–365, Apr. 1991.*

* cited by examiner

Primary Examiner—Rodney G. McDonald
(74) Attorney, Agent, or Firm—Burns, Doane, Swecker & Mathis, LLP

(57) ABSTRACT

A plasma processing method using helicon wave excited plasma which makes it possible to control a degree of dissociation for a process gas by controlling the source power. In the plasma processing method using helicon wave excited plasma, the source power applied to the plasma generator is set lower than a source power corresponding to a discontinuous change of a characteristic line indicating the dependency of electron density or saturated ion current density on source power.

15 Claims, 7 Drawing Sheets

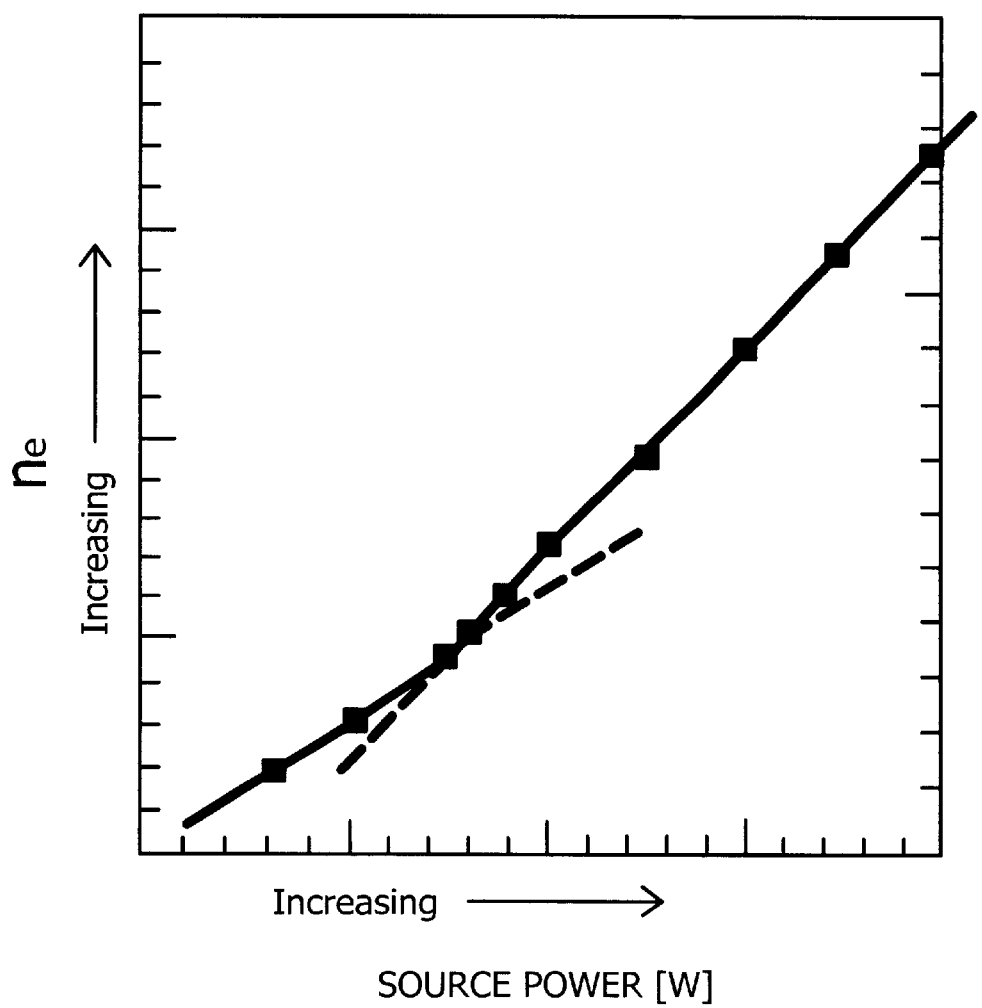

PLASMA PROCESSING METHOD

This application is a continuation of application Ser. No. 08/558,794, filed on Nov. 15, 1995 (now abandoned).

BACKGROUND OF THE INVENTION

The present invention relates to a plasma processing method, and in particular, to a plasma processing method for performing surface processing including, for example, etch processing and film deposition processing, on a semiconductor integrated circuit element, employing helicon wave excited plasma.

Keeping in mind the fineness and the sophistication of feature sizes of semiconductor integrated circuit elements, such as the size of a contact hole, provided by recent plasma processing techniques, it has been necessary to perform surface processing, in particular plasma etching, at a low pressure. The surface processing at a lower pressure gives rise to the problem of reducing the processing rate, such as etch rate and deposition rate, because the densities of ions and neutral active species are reduced at the lower pressure. Such reduction in processing rate is compensated for by using high-density plasma such as helicon wave excited plasma. Conventional helicon wave excited plasma methods are disclosed in U.S. Pat. Nos. 4,990,229, 5,091,049, and 5,122,251.

Conventional plasma processing methods employing helicon wave excited plasma have the advantage of obtaining a high degree of process gas dissociation even at low pressure. The high degree of process gas dissociation, however, gives rise to various problems. For example, in a case where the helicon wave excited plasma is applied to etch processing of silicon oxide film, the dissociation of hydrocarbon fluoride ($C_xH_yF_z$) gas used as an etching gas proceeds excessively, thereby producing a significant number of fluorine atom radicals. The fluorine atom radicals are etchants for silicon (Si) substrates, as well as silicon oxide films. The silicon substrates are used under the silicon oxide film as a base material. Through the silicon oxide film, the underlying silicon substrate is also etched by the fluorine atom radicals. Since the underlying silicon is etched by the fluorine atom radicals, a high etch-selective ratio of the silicon oxide film to the underlying silicon substrate cannot be achieved.

A specific example of the aforementioned problems will be given with reference to FIG. 5. FIG. 5 is a graph relating to the dependency of silicon oxide film and silicon etch rates, as well as the etch-selective ratio of silicon oxide film to silicon (silicon oxide film etch rate/silicon etch rate) to contact hole diameter at a source power of 1,750 W. This graph was obtained from etch rate data measurements taken from a plasma etching apparatus in which a helicon wave plasma source was built, a source power of 1,750 W was applied to the helicon wave plasma source, helicon wave excited plasma in $C_4F_8+H_2$ etching gas under a pressure 1.33 Pa was generated, and a silicon oxide layer formed on the silicon substrate was etched.

In general, a high power source is applied into a helicon wave plasma source to generate a high density plasma. In this evaluation, the applied source power is as high as 1,750 W.

In the coordinate system of the graph of FIG. 5, the horizontal axis indicates the contact hole diameter in $\mu$m, the left vertical axis indicates the etch rates of the silicon oxide film and underlying silicon (Å/min), and the right vertical axis shows the etch-selective ratio of silicon oxide film to underlying silicon. Because the silicon oxide film is laid on the underlying silicon substrate, the etching of the silicon substrate is started at the completion of the etching of the silicon oxide film. The thickness of the silicon oxide film is 1 $\mu$m. The etch rates of the silicon oxide film and the silicon substrate depend on the diameter of the contact hole. Referring to the FIG. 5, curve 51 represents the change in silicon etch rate, curve 52 represents the change in etch-selective ratio, and curve 53 represents the change in silicon oxide film etch rate.

From FIG. 5, it is clear from curve 52 that the etch-selective ratio of the silicon oxide film to the underlying silicon decreases with respect to the contact hole diameter. When the contact hole is, for example, 0.5 $\mu$m in diameter, the selective ratio of the silicon oxide film to underlying silicon is at most 23. This shows that the conventional plasma etching method employing helicon wave excited plasma has a problem of an extremely low etch-selective ratio of the silicon oxide film to underlying silicon.

SUMMARY OF THE INVENTION

To overcome the above-described problems, an object of the present invention is to provide a plasma processing method for controlling the degree of dissociation of a process gas in a helicon wave excited plasma. Another object of the present invention is to provide a plasma processing method for achieving a high etch-selective ratio of a silicon oxide film to underlying silicon.

In a first embodiment of the invention, there is provided a plasma processing method comprising applying a source power to a plasma generator through an antenna of a helicon wave plasma source system for generating a helicon wave excited plasma. The applied source power is set lower than a source power corresponding to a discontinuous change, what is called a mode jump, on a characteristic line of an electron density or a saturated ion current density as a function of a source power. The helicon wave excited plasma generated by the applied source power set lower than the source power corresponding to the discontinuous change is used to perform required surface processing of a substrate.

The first embodiment of the invention features setting the applied source power lower than a source power corresponding to a discontinuity on a characteristic line of an electron density as a function of source power (in the graph showing dependency of electron density on source power) or a saturated ion current density as a function of a source power (in the graph showing dependency of saturated ion current density on source power). Setting the applied source power lower than a source power corresponding to the discontinuous change on the characteristic line controls a degree of dissociation of the process gas. The control of the degree of dissociation prevents individual atoms constituting molecules of process gas from being liberated.

In contrast to this, setting the applied source power higher than a source power corresponding to a discontinuous change on a characteristic line causes excessive dissociation of the process gas, so that a considerable number of atom radicals are generated. When silicon oxide film is etched by hydrocarbon fluoride ($C_xH_yF_z$) gas, as etching gas, in which helicon wave excited plasma is generated, the generated fluorine atom radicals etch the underlying silicon, and thereby, reduces the etch-selective ratio of the silicon oxide film to underlying silicon.

However, if the applied source power is set lower than a source power corresponding to a discontinuous change of a characteristic line, the setting of the applied source power controls the dissociation to liberate the fluorine atom radicals from the hydrocarbon fluoride molecules, so that a high etch-selective ratio of silicon oxide film to underlying silicon can be achieved in etch processing of the silicon oxide film.

In the plasma processing method of a second embodiment of the present invention, a source power is applied to a plasma generator through a helicon wave plasma source antenna. The applied source power is set lower than a source power corresponding to a discontinuous change in a gradient of a straight line approximately linearized to a characteristic line of an electron density or a saturated ion current density as a function of a source power. Using the helicon wave excited plasma generated by the applied source power set lower than the source power corresponding to the discontinuous change in the gradient, the required surface processing to the substrate is performed.

The second embodiment of the invention features setting the applied source power lower than a source power corresponding to a discontinuous change in a gradient of a straight line approximately linearized to a characteristic line of an electron density or a saturated ion current density as a function of a source power. In the second embodiment of the invention, the discontinuous change in the gradient of the straight line approximately linearized to the characteristic line is taken as an index causing an excessive dissociation of the process gas.

An applied source power higher than a source power corresponding to a discontinuous change in the gradient causes excessive dissociation of the process gas. As a result, an applied source power higher than a source power corresponding to a discontinuous change in the gradient of a straight line approximately linearized to a characteristic line produces a considerable number of constituent atom radicals of the process gas molecules. Therefore, to control the degree of dissociation of the process gas, the source power, considered as an index to which a discontinuous change in the gradient of a straight line approximately linearized to a characteristic line, is set lower than a source power corresponding to this discontinuous change.

In one form of the invention, the plasma processing method used in the first or second embodiment of the invention is a plasma etch processing. Thus, the plasma etch processing is the most suitable for a plasma processing method of the invention.

In another form of the invention, the plasma processing method used in the aforementioned form of the invention is performed on silicon oxide film.

BRIEF DESCRIPTION OF THE DRAWINGS

FIG. 2A is a graph showing a characteristic line indicating the dependency of electron density on the source power.

DETAILED DESCRIPTION OF THE PREFERRED EMBODIMENTS

A description will be given of the preferred embodiments of the present invention with reference to the attached drawings.

Figure 1:
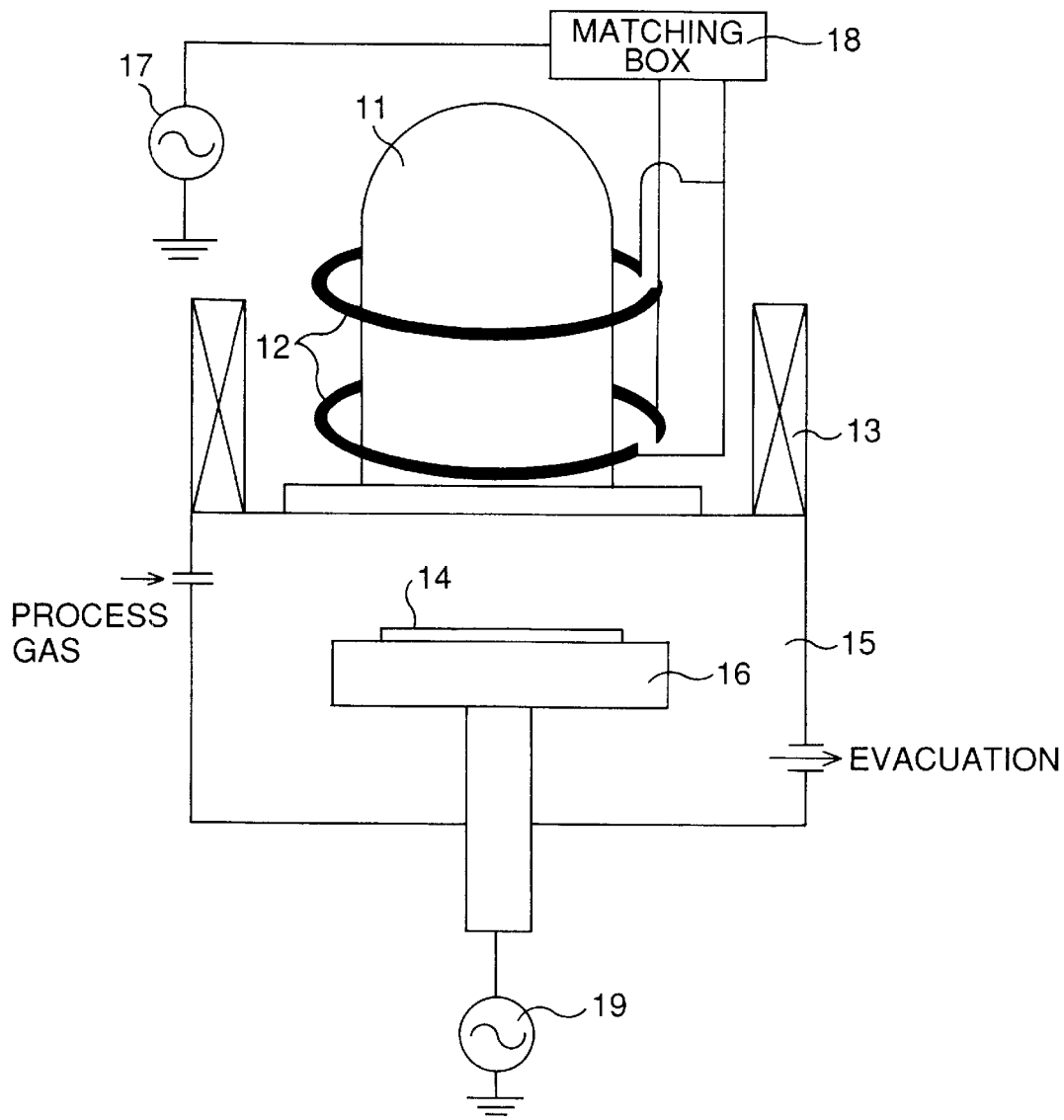
FIG. 1 is a schematic view of a plasma etching apparatus in which a helicon wave plasma source is built.

FIG. 1 is illustrative of a plasma etching apparatus in which a helicon wave plasma source is built. The plasma etching apparatus is a representative example of a plasma processing apparatus applied in the plasma processing method in accordance with the present invention. Referring to FIG. 1, the helicon wave plasma source has a plasma generator 11 formed of a dielectric, a pair of antennas 12 for generating a helicon-wave-exciting electrical field disposed around the plasma generator, an RF (13.56 MHz) power source 17 connected to the pair of antennas 12 through a matching box 18, and an electromagnetic coil 13 for generating the external magnetic field necessary to excite a helicon wave, disposed externally of the pair of antennas 12. The plasma generator 11 is disposed on the upper wall of a process chamber 15 in which a silicon substrate 14 subject to the plasma etch processing is placed. The substrate 14 is held on a substrate holder 16. The substrate holder 16 is connected to an RF power source 19 so as to allow application of bias power to the substrate 14.

The process chamber 15 is connected to a discharge space of the plasma generator 11. Introducing an etching gas into the process chamber 15 fills up the discharge space of the plasma generator 11 with the etching gas. To the discharge space filled with the etching gas is applied a source power from the RF power source 17 through the helicon-wave-exciting antennas 12. The plasma generator 11 generates helicon wave excited plasma through the medium of the etching gas by application of the source power. The helicon wave excited plasma generated by the plasma generator 11 diffuses into the process chamber 15 in which the silicon substrate 14 is placed. Diffusion of the helicon wave excited plasma causes the surface of the substrate 14 to be etched.

RF power is supplied to the helicon wave excitation antennas 12, both of which are formed into a ring shape, from the RF power source 17 through the matching box 18. The RF power supplied from the RF power source 17 is source power applied to the plasma generator 11.

RF power is supplied to the substrate holder 16 from another RF power source 19. The RF power supplied from the RF power source 19 is a bias power for controlling the energetic ions to impinge onto the substrate 14.

It is preferable to generate a multi-cusped magnetic field over the inner wall surface of the process chamber 15. The multi-cusped magnetic field suppresses plasma losses around the inner wall surface of the process chamber 15. The multi-cusped magnetic field is generated by bar-shaped permanent magnets (not illustrated), which are disposed outside the process chamber 15, with their north and south poles alternately arranged.

An index assisting in setting the applied source power is determined based on the abruptly prominent change, what is called a mode jump, on a characteristic line of a saturated ion current density or an electron density, or in a gradient of a straight line approximately linearized the characteristic line as described below.

In the plasma etching apparatus of FIG. 1, the dependency of a saturated ion current density ($I_s$) of the helicon wave excited plasma on the source power, or the dependency of an electron density ($n_e$) of the helicon wave excited plasma on the source power is determined by changing the source power value alone with the process conditions except the source power made constants. The saturated ion current density or the electron density is measured using a plasma parameter measuring instrument such as a Langmuir probe, a double probe or a micro-wave interferometer.

The method of measuring the saturated ion current density or the electron density with a cylindrical Langmuir probe is as follows. The cylindrical Langmuir probe is inserted into process chamber 15 through a vacuum seal. The end of the cylindrical Langmuir probe, which is exposed to the atmosphere, is connected to a direct current (dc) power source through a resistance of 10 to 100 Ω. The voltage across the resistance is measured with a voltmeter. The electron density is determined from both the probe current detected from the potential difference across the resistance and the probe-applied voltage readable from the voltmeter with the applied voltage of the dc power source being changed. To measure the saturated ion current density, a voltage applied to the probe from the dc power source is set to a negative potential with respect to the plasma potential, enough to repel almost all of the electrons coming to the probe. The saturated ion current density is obtained from the probe current readable from the voltmeter. More specifically, in the usual helicon wave excited plasma, a probe-applied voltage of about −70 V is suitable for measurement of the saturated ion current density.

Figure 2:
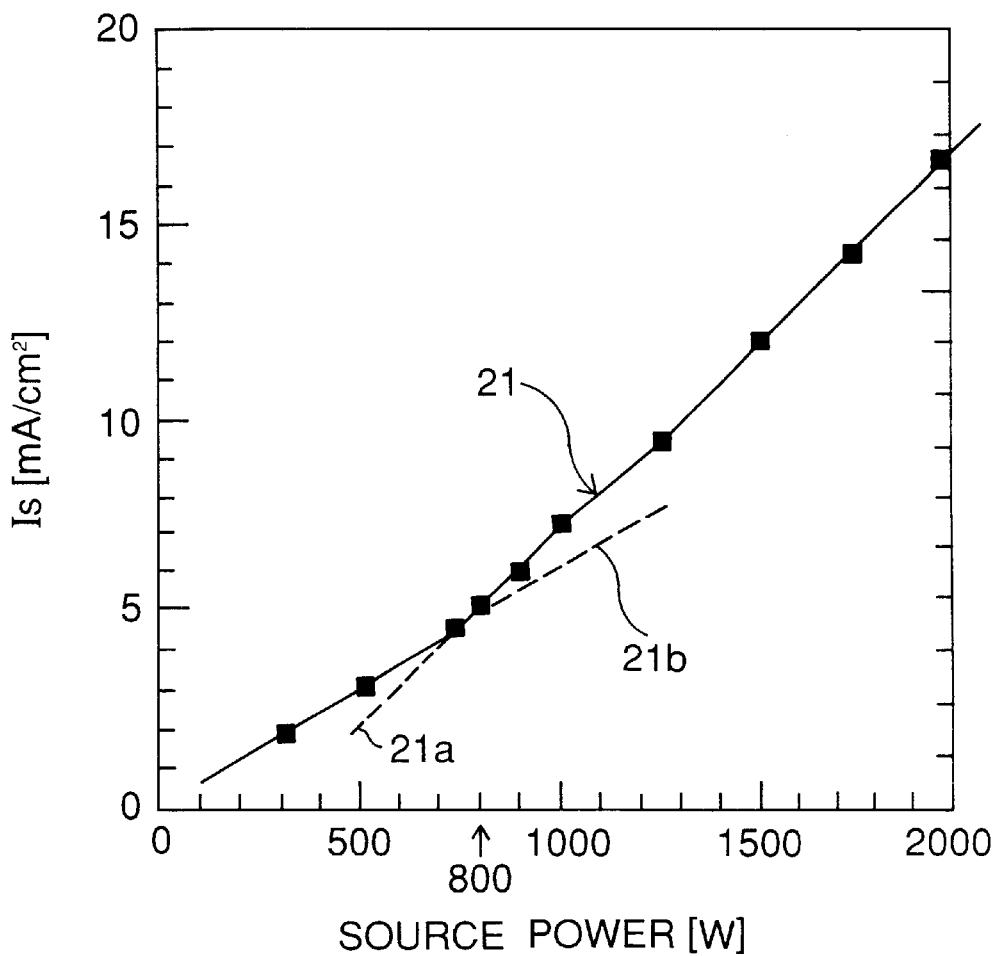
FIG. 2 is a graph showing a characteristic line indicating the dependency of the saturated ion current density on the source power.

While the source power applied from the RF power source 17 is being changed, changes in the saturated ion current density or the electron density in a helicon wave excited plasma is measured through the cylindrical Langmuir probe. Examples measured are illustrated in FIG. 2. FIG. 2 illustrates a characteristic line of the dependency of the saturated ion current density in the gradient on the source power.

FIG. 2 illustrates a curve 21 which represents a change in the saturated ion current density $I_s$ (mA/cm$^2$) with respect to the source power (Watt (W)), in helicon wave excited plasma of a mixture of $C_4F_8$ gas and $H_2$ gas under a pressure of 1.33 Pa. In FIG. 2, the curve 21 is indicated as a straight approximately linearized to a characteristic line.

Figure 3:
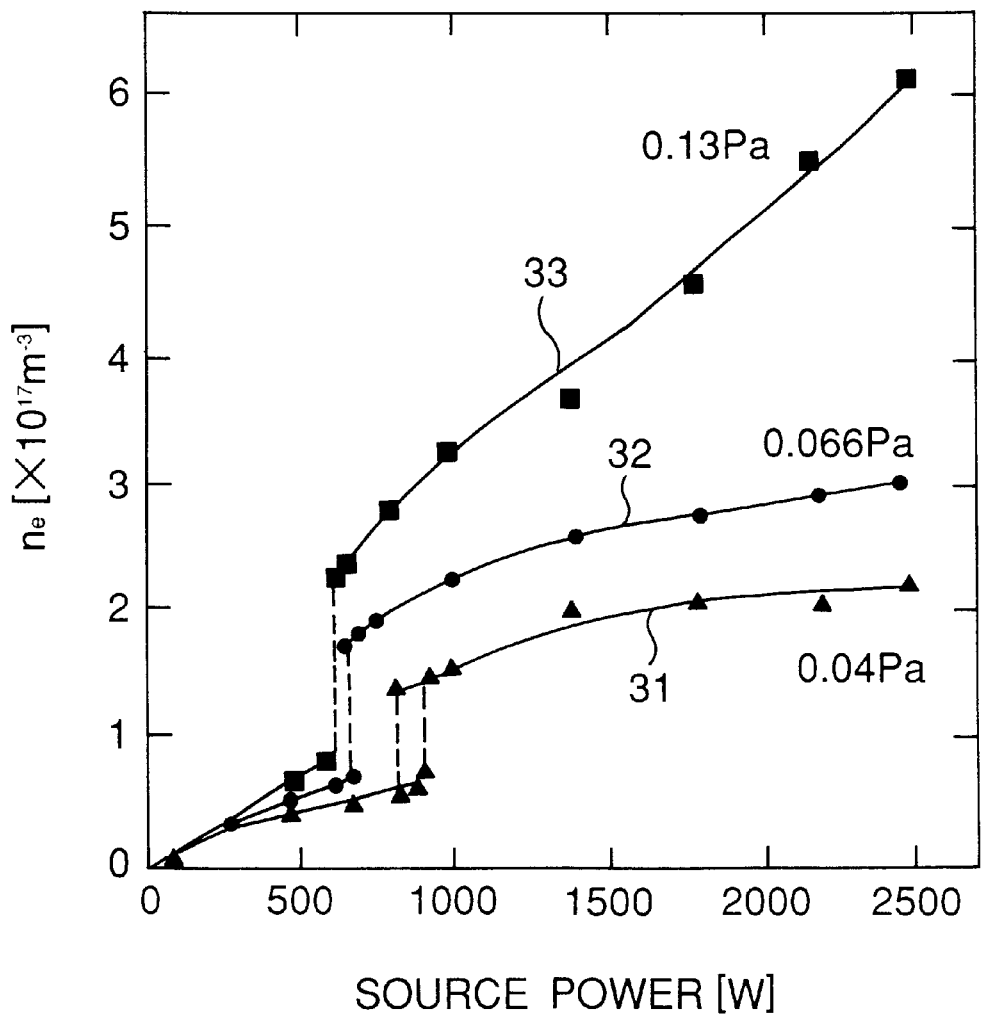
FIG. 3 is a graph showing characteristic lines indicating the dependency of electron density on the source power.
Figure 3A:
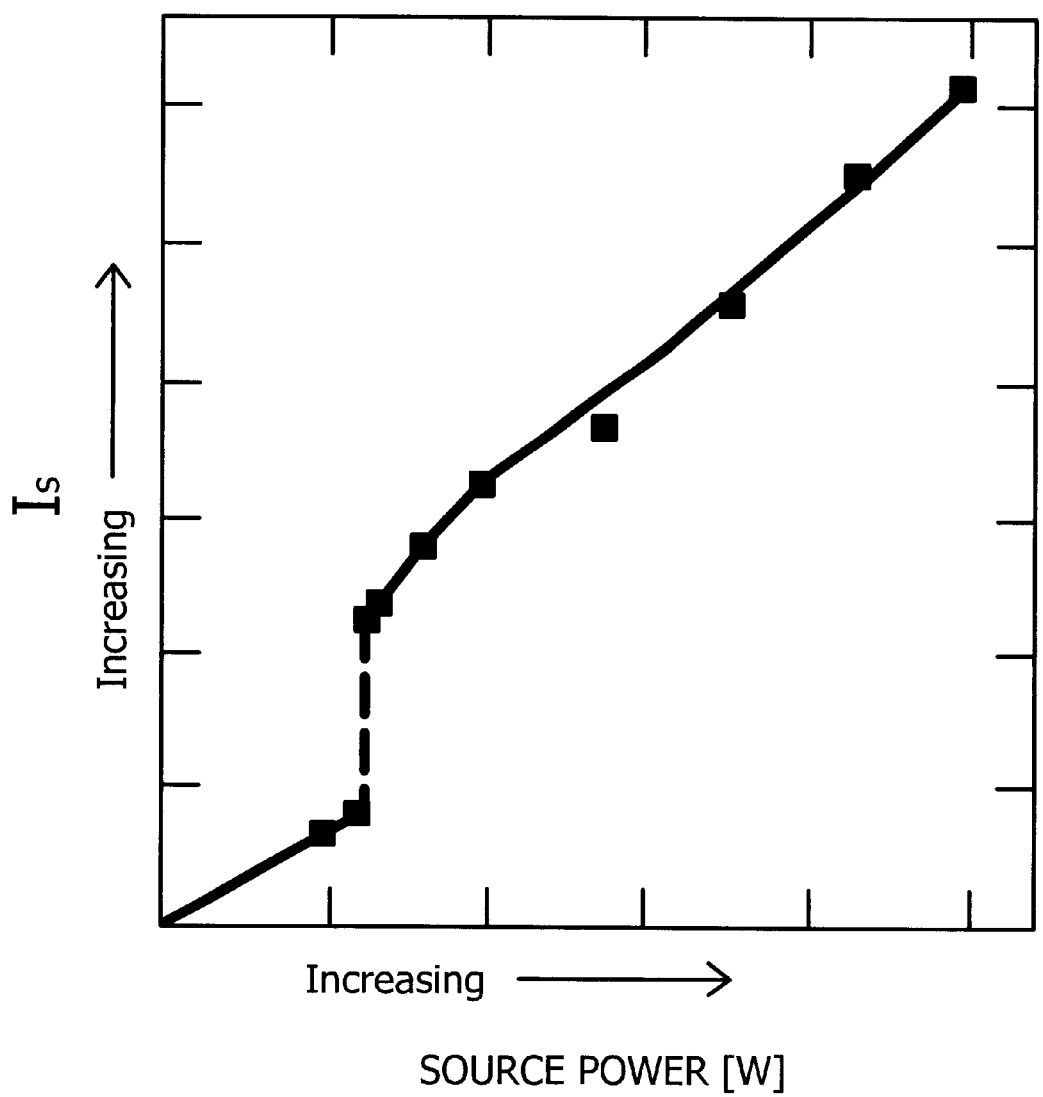
FIG. 3A is a graph showing a characteristic line indicating the dependency of saturated ion current density on the source power.

FIG. 3 illustrates characteristic lines of the dependency of the electron density on the source power. FIG. 3 illustrates curves 31, 32, and 33 each indicating the electron density $n_e$ (×10$^{17}$ m$^{-3}$) with respect to the source power in chlorine gas helicon wave excited plasma (T. NAKANO et al.; OUYO BOTSURI Vol. 61, No. 7 (1992), pp 711–717). The curve 31 indicates the electron density at 0.04 Pa, the curve 32 at 0.066 Pa, and the curve 33 at 0.13 Pa, respectively. A curve having a mode jump, as shown curves 31, 32 and 33, is conventionally well known in the inductively-coupled plasma.

The following relationship is established between the saturated ion current density ($I_s$) and the electron density ($n_e$): $I_s = q n_e e^{-1/2} (kT_e/m_i)^{1/2}$ (where e represents a base of natural logarithm; q represents an elementary charge; k represents the Boltzmann's constant; $T_e$ represents the electron temperature; and $m_i$ represents the ion mass). Therefore, when either one of the saturated ion current density or the electron density is determined, the other can be obtained from the aforementioned relationship.

The curves of FIGS. 2 and 3 indicate how the saturated ion current density and electron density depend on the source power (curves 21, 31, 32, and 33) will hereunder be referred to as characteristic lines.

In the curve 21 of FIG. 2, with respect to the straight line approximately linearized characteristic line, its gradient changes at a source power of approximately 800 W. More specifically, the gradient of a straight line portion 21a with respect to a source power greater than 800 W is larger than the gradient of a straight line portion 21b with respect to a source power less than 800 W. When the applied source power is greater than 800 W, the gradient of the straight line portion 21a is so large that helicon wave excited plasma is effectively generated. However, excessive dissociation of the process gas occurs at more than 800 W. In other words, an extremely large number of atom radicals are liberated from the process gas molecules. Therefore, in this case, 800 W is the index for the applied source power. The applied source power of less than 800 W suppresses excessive dissociation of the process gas in the helicon wave excited plasma.

In the curves 31, 32 and 33 of FIG. 3, characteristic lines change discontinuously with increase in source power. The source power corresponding to a discontinuous change is approximately 600 W at a pressure of 0.13 Pa, approximately 670 W at a pressure of 0.066 Pa, and approximately 830 W to approximately 900 W at a pressure of 0.04 Pa. Therefore, in this case, the index for applied source power is approximately 600 W at a pressure of 0.13 Pa, approximately 670 W at a pressure of 0.066 Pa, and approximately 830 W to approximately 900 W at a pressure of 0.04 Pa.

Accordingly, in the plasma processing method of the present invention, the applied source power is determined such that the applied source power is less than a source power corresponding to a discontinuous change on a characteristic line of an electron density or a saturated ion current density as a function of a source power (or characteristic line indicating dependency of electron density or saturated ion current density on source power), or a discontinuous change in a gradient of a straight line approximately linearized to the characteristic line.

In the aforementioned description, with regard to the saturated ion current density, the applied source power is set based on a discontinuous change in the gradient of the straight line approximately linearized to the characteristic line of an electron density or a saturated ion current density as a function of a source power. However, in a case where the characteristic line of the saturated ion current density changes discontinuously as shown in FIG. 3, an applied source power is set lower than the source power corresponding to a discontinuous change as an index. On the other hand, with regard to the electron density, a source power is set based on a discontinuous change of a characteristic line of electron density as a function of a source power. However, in a case where the characteristic line of the electron density is a line as shown in FIG. 2, this line is represented by a straight line approximately linearized to the characteristic line of the electron density, in which a source power corresponding to a discontinuous change in a gradient of a straight line is an index used to set an applied source power lower than this index.

A description of an example in which the plasma processing method of the present invention is applied to etch a silicon oxide film is provided below.

The silicon substrate 14, subjected to the desired patterning using a resist on the silicon oxide film, is held on the substrate holder 16 in the process chamber 15.

To operate the helicon wave excited plasma source of FIG. 1, the plasma generator 11 and the process chamber 15 are evacuated by a vacuum pump (not illustrated). Then, by a gas introducing mechanism (not illustrated), hydrocarbon fluoride ($C_xH_yF_z$) gas such as $CHF_3$, $C_2F_6$, $C_4F_8$, $C_4F_8+H_2$ or $C_4F_8+H_2+CH_2F_2$ gases is supplied to the process chamber 15 through a mass-flow controller (not illustrated) by which the flow rate is controlled. A variable orifice (not illustrated), located between the process chamber 15 and the vacuum pump, is controlled by a pressure controller (not illustrated) to regulate the pressure in the range of from 0.1 to 10 Pa. Thereafter, source power is supplied to the pair of antennas 12 through the matching box from the RF power source 17. At the same time, a 600 W bias power is supplied from the RF power source 19 to the substrate holder to control an ion-impinging energy.

In the above-described operation, to suppress excessive dissociation of the etching gas introduced into the process chamber 15, the source power to be applied to the antennas 12 is set lower than a source power corresponding to a discontinuous change of a characteristic line of an electron density or a saturated ion current density, or a discontinuously changing gradient of the approximately linearized characteristic line.

Figure 4:
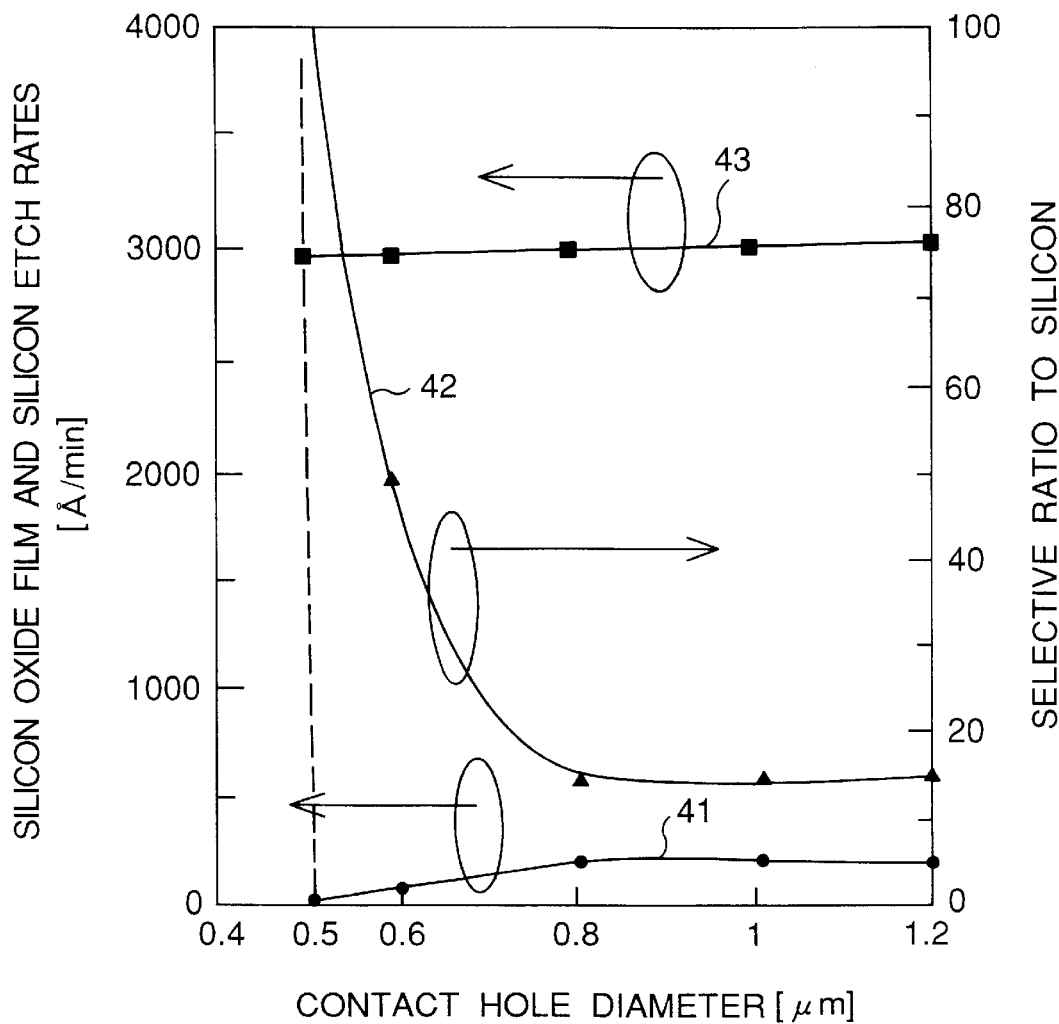
FIG. 4 is a graph showing etching characteristics for a silicon oxide film.
Figure 5:
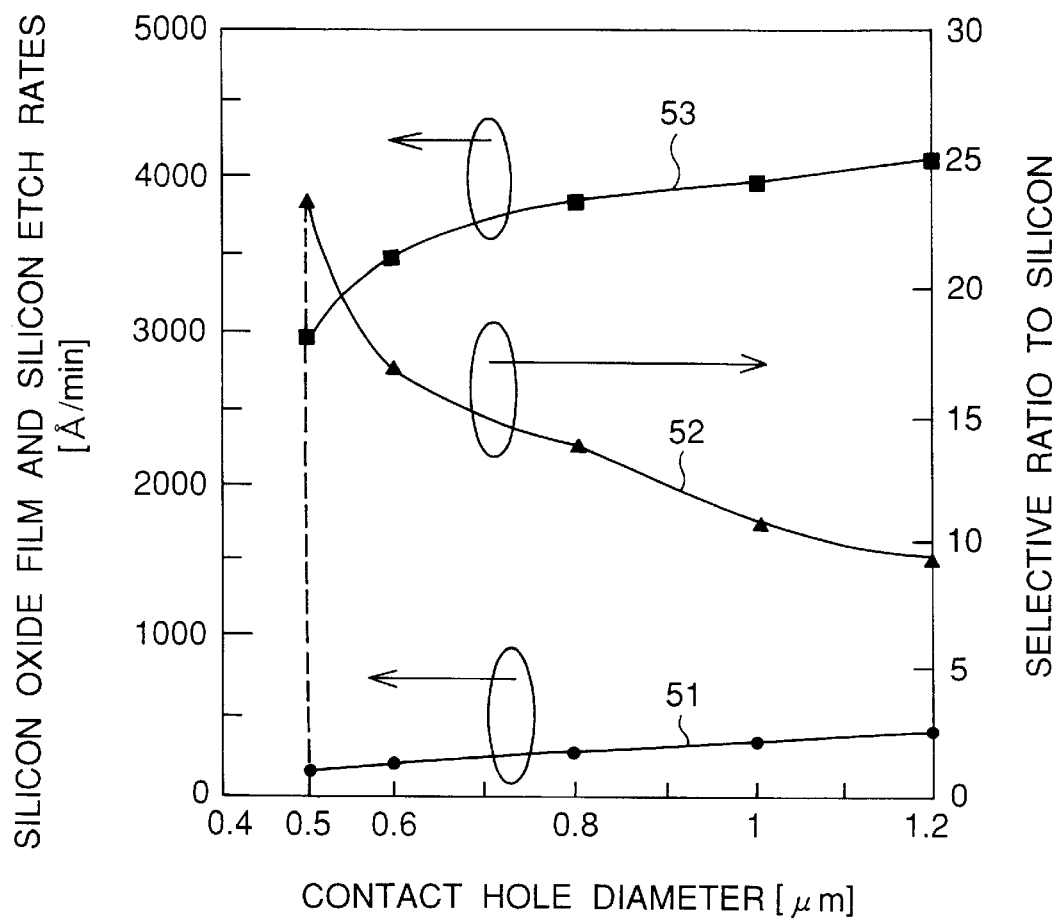
FIG. 5 is a graph showing conventional etching characteristics for a silicon oxide film.

An embodiment of the etch processing to silicon oxide film is illustrated in FIG. 4. In this embodiment, in the plasma etching apparatus of FIG. 1, 300 W of source power is applied to generate helicon wave excited plasma in a mixture of $C_4F_8$ gas and $H_2$ gas, the mixture being the etching gas, at a pressure of 1.33 Pa to etch silicon oxide film. In the FIG. 4, reference numeral 41 represents a curve for a silicon etch rate, reference numeral 42 a curve for an etch-selective ratio, and reference numeral 43 a curve for a silicon oxide film etch rate.

As shown in FIG. 2, it has been confirmed that at approximately 800 W, there is a change in the gradient of the straight line approximately linearized characteristic line of saturated ion current density as a function of applied source power. When the source power applied to the plasma generator 11 is 300 W, as shown in FIG. 4, at a bias power of 600 W, with a contact hole having a diameter of 0.5 µm, the etch-selective ratio of the silicon oxide film to the underlying silicon becomes infinitely large. Even when this applied source power is raised to 500 W and even further the bias power is raised to 1500 W, with the contact hole of the same diameter of 0.5 µm, the selective ratio of the silicon oxide film to the underlying silicon is still infinitely large. Even with a contact hole having a smaller diameter of less than 0.5 µm, the etch-selective ratio of the silicon oxide film to the underlying silicon is still infinitely large.

Although in the aforementioned embodiment silicon oxide film etched by a helicon wave plasma source was taken as an example, the plasma processing method of the present invention is not limited to the aforementioned embodiment. It is obvious that the present invention is applicable to any type of plasma processing requiring control of a degree of dissociation of the etching gas in high-density plasma. Examples of such plasma processings include, in addition to the above-described dry etching, plasma irradiation and plasma enhanced CVD.

As is clear from the aforementioned description, according to the plasma process method using helicon wave excited plasma of the present invention, the applied source power is set lower than a source power corresponding to a discontinuous change on a characteristic line indicating the dependency of electron density or saturated ion current density on the source power, or a discontinuous change in a gradient of the characteristic line. The degree of dissociation of the etching gas molecules is optimally controlled by setting of the applied source power. More specifically, the setting of the applied source power allows a high-density plasma gas in which desired etchants (etching species) are optimally generated to be provided. In the plasma processing employing helicon wave excited plasma, such setting of the applied source power makes it possible to control the degree of dissociation of the etching gas and to increase the etch-selective ratio of the silicon oxide film to the underlying silicon.

What is claimed is:

1. A plasma processing method using helicon wave excited plasma comprising the steps of:
   controlling dissociation of a processing gas by setting an applied source power lower than a source power corresponding to a discontinuous change on a characteristic line of electron density or saturated ion current density as a function of a power source.

2. A plasma processing method according to claim 1, wherein said plasma processing is etch processing.

3. A plasma processing method according to claim 2, wherein said etch processing is performed on silicon oxide film.

4. A plasma processing method according to claim 1, wherein said plasma processing is performed on a substrate having a contact hole diameter of less than 0.8 µm.

5. A plasma processing method according to claim 4, wherein said plasma processing is performed on a substrate having a contact hole diameter of less than 0.6 µm.

6. A plasma processing method according to claim 5, wherein said plasma processing is performed on a substrate having a contact hole diameter of less than 0.5 µm.

7. A plasma processing method using a helicon wave excited plasma comprising the steps of:
   controlling dissociation of a processing gas by setting an applied source power lower than a source power corresponding to a discontinuous change in a gradient of a straight line approximately linearized to a characteristic line of electron density or saturated ion current density as a function of a source power.

8. A plasma processing method according to claim 7, wherein said plasma processing is an etch processing.

9. A plasma processing method according to claim 8, wherein said etch processing is performed on silicon film.

10. A plasma processing method according to claims 7, wherein said plasma processing is performed on a substrate having a contact hole diameter of less than 0.8 µm.

11. A plasma processing method according to claim 10, wherein said plasma processing is performed on a substrate having a contact hole diameter of less than 0.6 µm.

12. A plasma processing method according to claim 11, wherein said plasma processing is performed on a substrate having a contact hole diameter of less than 0.5 µm.

13. A plasma processing method using helicon wave excited plasma comprising the steps of:
   controlling dissociation of a processing gas by setting an applied source power lower than a source power corresponding to a discontinuous change on a characteristic line of electron density or saturated ion current density as a function of a source power, or lower than a source power corresponding to a discontinuous change in a gradient of a straight line approximately linearized to a characteristic line of electron density or saturated ion current density as a function of a source power, and at a contact hole diameter selected to provide an infinitely large etch-selective ratio.

14. A plasma processing method according to claim 13, wherein said plasma processing is an etch processing.

15. A plasma processing method according to claim 14, wherein said etch processing is performed on silicon oxide film.

* * * * *